United States Patent
Bharathraj et al.

(10) Patent No.: US 11,959,968 B2
(45) Date of Patent: Apr. 16, 2024

(54) METHOD AND SYSTEM WITH BATTERY MANAGEMENT

(71) Applicant: SAMSUNG ELECTRONICS CO., LTD., Suwon-si (KR)

(72) Inventors: Sagar Bharathraj, Bangalore (IN); Anshul Kaushik, Bangalore (IN); Rajkumar Subhash Patil, Bangalore (IN); Shashishekara Parampalli Adiga, Bangalore (IN); Tae Won Song, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 231 days.

(21) Appl. No.: 17/463,841

(22) Filed: Sep. 1, 2021

(65) Prior Publication Data
US 2022/0074995 A1   Mar. 10, 2022

(30) Foreign Application Priority Data

Sep. 10, 2020 (IN) .............................. 202041039206
May 10, 2021 (IN) ............................ 2020 41039206
Aug. 3, 2021 (KR) ........................ 10-2021-0102090

(51) Int. Cl.
| | |
|---|---|
| *G01R 31/367* | (2019.01) |
| *B60L 58/12* | (2019.01) |
| *B60L 58/16* | (2019.01) |
| *G01R 31/371* | (2019.01) |
| *G01R 31/382* | (2019.01) |
| *G01R 31/392* | (2019.01) |

(52) U.S. Cl.
CPC ............ *G01R 31/367* (2019.01); *B60L 58/12* (2019.02); *B60L 58/16* (2019.02); *G01R 31/371* (2019.01); *G01R 31/382* (2019.01); *G01R 31/392* (2019.01)

(58) Field of Classification Search
None
See application file for complete search history.

(56) References Cited

U.S. PATENT DOCUMENTS

| | | | |
|---|---|---|---|
| 7,612,538 | B2 | 11/2009 | Cho et al. |
| 7,615,967 | B2 | 11/2009 | Cho et al. |
| 7,615,969 | B2 | 11/2009 | Meng et al. |

(Continued)

FOREIGN PATENT DOCUMENTS

| | | |
|---|---|---|
| CN | 102290618 A | 12/2011 |
| JP | 6604478 B2 | 11/2019 |
| KR | 10-1329915 B1 | 11/2013 |

*Primary Examiner* — Roy Y Yi
(74) *Attorney, Agent, or Firm* — NSIP Law

(57) ABSTRACT

A battery management method and system are provided. The method includes acquiring one or more parameters associated with the battery. The one or more parameters includes a current level, a voltage level, a State of Charge (SOC), and a temperature. The method includes determining a load and energy estimation model based on the one or more acquired parameters. The method includes identifying a power limit of the battery based on the load and energy estimation model. The method includes determining a power margin of the battery at a first usage time interval based on the identified power limit. The method includes performing one or more actions, based on a determination that the power margin of the battery exceeds a predefined threshold level.

17 Claims, 10 Drawing Sheets

(56) References Cited

U.S. PATENT DOCUMENTS 9,217,779 B2 12/2015 Xu et al.
10,444,292 B2 10/2019 Park et al.
2019/0064914 A1* 2/2019 Krishnakumar ...... G06F 1/3234

* cited by examiner

METHOD AND SYSTEM WITH BATTERY MANAGEMENT

CROSS-REFERENCE TO RELATED APPLICATIONS

This application claims the benefit under 35 USC § 119(a) of Indian Provisional Patent Application No. 202041039206, filed on Sep. 10, 2020, in the Indian Patent Office, Indian Non-Provisional Application 202041039206 filed on May 10, 2021, in the Indian Patent Office, and Korean Patent Application No. 10-2021-0102090, filed on Aug. 3, 2021, in the Korean Intellectual Property Office, the entire disclosures of which are incorporated by reference for all purposes.

BACKGROUND

1. Field

The following description relates to methods and systems with battery management.

2. Description of Related Art

Real-time on-line estimation of peak performance limits of battery-operated systems and devices (such as mobile phones, electrical vehicle (EV), and so on) may provide for a smooth user experience. An example task may be the peak power and energy availability estimation, where the peak power and energy availability estimation predicts a drawable power, e.g., a maximum drawable power, at any instant, and available energy capacity from the battery-operated systems and devices until shutdown.

On multiple occasions, the battery-operated systems and devices may go into a shut down mode without any prior indication to the user, especially when near an end of discharge of the battery or when there are environmental changes in performance influencing parameters like ambient temperature. This problem occurs as empirical and look up table-based predictions of maximum current/available energy is done. The look up tables and formulations do not take into account the physics of the battery especially when there are changes in sensitive parameters like temperature.

In an example, it is quite possible that a user of the electronic device may want to use applications that utilize a great deal of power, such as gaming applications on the electronic device (e.g., smart phone). Thus, the demand for instantaneous power increases on the electronic device, so that the battery may shut down without notice.

In another example, the user of the EV may suddenly increase a load on the EV due to a steep incline in a roadway. Thus, the demand for instantaneous power increases. This may cause the battery to shut down without any notice.

In another example, the user of the electronic device might have moved from a relatively warm environment to a cold environment. Existing methods may fail to accurately incorporate the effect of performance influencing parameters, such as temperature, on the battery. The significant drop in maximum extractable current with drop in temperature is not captured by the existing methods. Hence, the battery may shut down without any notice to the user.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a battery management method includes determining, by a battery management system, a load and energy estimation model based on at least one acquired parameter associated with the battery, wherein the at least one parameter comprises a current level, a voltage level, a state of charge (SOC), a temperature, or a combination of at least two of the parameters thereof; identifying, by the battery management system, a power limit of the battery based on the determined load and determined energy estimation model; determining, by the battery management system, a power margin of the battery at a first usage time interval based on the identified power limit; and performing, by the battery management system, at least one action, based on a determination that the power margin of the battery exceeds a predefined threshold level.

The at least one parameter may be acquired by the battery management system.

The determining, by the battery management system, of the load and energy estimation model may include: obtaining, by the battery management system, a pulse duration of the battery, a depth of discharge of the battery, a cut-off voltage associated with a pre-set voltage of the battery, and a temperature of the battery at a first time interval based on the at least one acquired parameters; and determining, by the battery management system, the load and energy estimation model based on the pulse duration of the battery, the depth of discharge of the battery, the cut-off voltage associated with the pre-set voltage of the battery, and the temperature of the battery.

The at least one action may include notifying a user to close at least one application running in an electronic device, notifying the user to close at least one background application running in the electronic device, reducing a clock speed of a processor of the electronic device, notifying the user of a remaining capacity of the battery, notifying the user of a maximum current extractable from the battery at a discharge condition, notify the user of a temperature dependent effect of the battery, predicting a state of health (SOH) of the battery, providing a route based on power demands in a vehicle, notify a user of the vehicle to charge the battery, or a combination of at least two of the actions thereof.

The load and energy estimation model may be determined based on a change in at least one of an ambient temperature of the battery and a cell temperature of the battery.

The load and energy estimation model may be determined when a discharge mode of the battery is changed from a first level to a second level.

The SOH of the battery may be predicted by: obtaining a maximum current profile associated with a fresh battery; estimating a maximum current profile associated with the battery based on the load and energy estimation model; determining a ratio of the estimated maximum current profile associated with the battery with the maximum current profile associated with the fresh battery; and predicting the SOH of the battery based on the determined ratio.

In a general aspect, a battery management system includes one or more processors; a memory; and a load and energy estimation model configuration controller, coupled with the one or more processors and the memory, and configured to: determine a load and energy estimation model based on at least one acquired parameter associated with the battery, wherein the at least one parameter comprises a current level, a voltage level, a state of charge (SOC), a temperature, or a combination of at least two of the parameters thereof, determine a load and energy estimation model based on the at least one acquired parameter, identify a power limit of the battery based on the load and energy estimation model, determine a power margin of the battery at a first usage time interval based on the identified power limit, and perform at least one action based on a determination that the power margin of the battery exceeds a predefined threshold level.

The at least one parameter may be acquired by the battery management system.

The determining of the load and energy estimation model may include obtaining a pulse duration of the battery, a depth of discharge of the battery, a cut-off voltage associated with a pre-set voltage of the battery, and a temperature of the battery at a first time interval based on the at least one acquired parameter; and determining the load and energy estimation model based on the pulse duration of the battery, the depth of discharge of the battery, the cut-off voltage associated with the pre-set voltage of the battery, and the temperature of the battery.

The at least one action may include notifying a user to close at least one application running in an electronic device, notifying the user to close at least one background application running in the electronic device, reducing a clock speed of a processor of the electronic device, notifying the user of a remaining capacity of the battery, notifying the user of a maximum current extractable from the battery at a discharge condition, notifying the user of a temperature dependent effect of the battery, predicting a state of health (SOH) of the battery, providing a route based on power demands of a vehicle, notify a user of the vehicle to charge the battery, or a combination of at least two of the actions thereof.

The load and energy estimation model may be determined based on a change in at least one of an ambient temperature of the battery and a cell temperature of the battery.

The load and energy estimation model may be determined when a discharge mode of the battery is changed from a first level to a second level.

The SOH of the battery may be predicted by: obtaining a maximum current profile associated with a fresh battery; estimating a maximum current profile associated with the battery based on the load and energy estimation model; determining a ratio of the estimated maximum current profile associated with the battery with the maximum current profile associated with the fresh battery; and predicting the SOH of the battery based on the determined ratio.

In a general aspect, an apparatus includes one or more processors, configured to: determine a load and energy estimation model based on an obtained parameter associated with a battery; identify a power limit of the battery based on the determined load and energy estimation model; determine a power margin of the battery at a usage time interval based on the identified power limit, and perform a user-based action when the power margin is determined to exceed a predetermined threshold level.

The apparatus may be at least one of an electronic device and an electric vehicle.

The at least one battery-related parameter may include a current level, a voltage level, a state of charge (SOC), and a temperature.

The user-based action may include at least one of notifying a user to close at least one application running in an electronic device, notifying the user to close at least one background application running in the electronic device, reducing a clock speed of a processor of the electronic device, notifying the user of a remaining capacity of the battery, notifying the user of a maximum current extractable from the battery at a discharge condition, notifying the user of a temperature dependent effect of the battery, predicting a state of health (SOH) of the battery, providing a route based on power demands of a vehicle, notify a user of the vehicle to charge the battery.

Other features and aspects will be apparent from the following detailed description, the drawings, and the claims.

Figure 1:
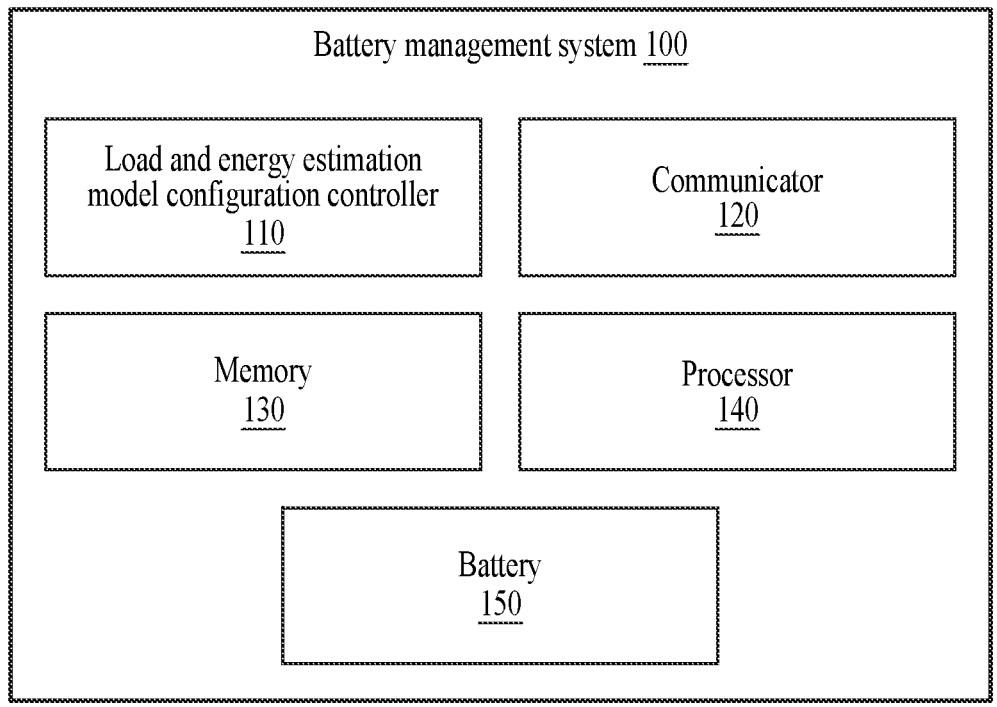
FIG. 1 illustrates various hardware components of an example battery management system, in accordance with one or more embodiments.

Throughout the drawings and the detailed description, unless otherwise described or provided, the same drawing reference numerals will be understood to refer to the same, or like, elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness, noting that omissions of features and their descriptions are also not intended to be admissions of their general knowledge.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Throughout the specification, when an element, such as a layer, region, or substrate is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Unless otherwise defined, all terms, including technical and scientific terms, used herein have the same meaning as commonly understood by one of ordinary skill in the art to which this disclosure pertains and after an understanding of the disclosure of this application. Terms, such as those defined in commonly used dictionaries, are to be interpreted as having a meaning that is consistent with their meaning in the context of the relevant art and the disclosure of this application, and are not to be interpreted in an idealized or overly formal sense unless expressly so defined herein.

The terms "power limit management", "power limit estimation", "current limit estimate (CLE)" and "load and energy estimation model" are used interchangeably in the following disclosure.

Examples herein are related to a battery management method. Such a method includes acquiring, by a battery management system, one or more parameters associated with the battery. The one or more parameters include a current level, a voltage level, a State of Charge (SOC), a temperature, or a combination of at least one or two thereof. Further, such a method includes determining, by the battery management system, a load and energy estimation model based on the one or more acquired parameters. Further, such a method includes identifying, by the battery management system, a power limit of the battery based on the load and energy estimation model. Further, such a method includes determining, by the battery management system, a power margin of the battery at a first usage time interval based on the identified power limit. Further, such a method includes performing, by the battery management system, one or more actions, on determining that the power margin of the battery exceeds a predefined threshold level.

Unlike typical methods and systems, one or more examples can be used to estimate power limits and energy availability of the battery in a real-time and inform the user regarding the battery limitations in a simple, accurate and quick manner. One or more examples may be used to predict a power limit estimation (PLE) current required for the battery management system to reach a specified cut-off voltage in a specified time (e.g., 1 second) at different depths of discharge. One or more examples may be used to estimate available maximum current (and thus power, for example) for on-board implementation on the battery management system. One or more examples may utilize a power of the load and energy estimation model which estimates the states of the cell, i.e., state of charge, open circuit potential and temperature, in real time and accurate manner.

In one or more examples, a real time internal resistance parameter can be estimated, that is critical to the power level capability of a cell of the battery, and may be heavily influenced by a state of charge and cell temperature of the battery. One or more examples may be used to provide a desirable user experience for eliminating unanticipated battery behavior such as sudden battery power loss when exposed to extremities of temperature.

Based on one or more examples, in an example, a user of the electronic device may want to use applications that utilize high levels of power (such as, but not limited to, gaming applications) on the example electronic device (for example, smart phone, tablet, or any other device capable of running one or more applications, in various non-limiting embodiments). Thus, the demand for instantaneous power increases on the electronic device, so that a battery management system notifies the user about the battery power level, and suggests that the user charge the battery to continue playing the gaming application on the electronic device. This may result in avoiding the shutting down of the battery.

Based on the examples, in another example, the user of the EV may suddenly increase a load on the EV due to a steep incline on a road surface. Thus, the demand for instantaneous power increases, so that the battery management system notifies the user about the battery power level and suggests to the user to charge the battery for a certain range. This may avoid the shutting down of the battery in the vehicle.

Based on one or more examples, in another example, the user of the electronic device may have moved from a relatively warm environment to a cold environment. Based on one or more examples, a battery management system may accurately incorporate the effect of performance influencing parameters (e.g., temperature) on the battery, so that the significant drop in maximum extractable current with drop in temperature is captured. Thus, as an example, a battery management system (100) may avoid the shutting down of the battery (150) without notice to the user. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

One or more examples may manage the battery to accurately predict the maximum load and energy available in the battery.

One or more examples may determine a load and energy estimation model based on a pulse duration of the battery, a depth of discharge of the battery, a cut-off voltage associated with a pre-set voltage of the battery, and a temperature of the battery.

One or more examples may estimate a maximum current extractable from the battery at any given discharge condition and given a discharge cut-off voltage and duration for which the current is required by using the load and energy estimation model.

One or more examples may estimate a temperature dependent effect on the battery at any given discharge condition and given the discharge cut-off voltage and duration for which the current is required by using the load and energy estimation model.

One or more examples may estimate a temperature dependent effect on the battery for a wide range of temperatures from −30° C. to 60° C. by using the load and energy estimation model.

One or more examples may provide a real-time update of parameter variation associated with the battery to a user of the battery management system for appropriate action to be taken in a simple, quick and accurate manner.

Referring now to the drawings, and more particularly to FIGS. 1 through 8, where similar reference characters denote corresponding, or like, features consistently throughout the figures, there are shown at least one embodiment.

FIG. 1 illustrates various hardware components of a battery management system (100), according to various non-limiting examples.

In an example, the battery management system (100) includes a load and energy estimation model configuration controller (110), a communicator (120), a memory (130), a processor (140) and a battery (150). The processor (140) is operated with the load and energy estimation model configuration controller (110), the communicator (120), the memory (130) and the battery (150). The battery (150) can be, for example, but not limited to, a Lithium Ion (Li-Ion) battery, a Molten Salt (Na—NiCl$_2$) battery, a Nickel Metal Hydride (Ni-MH) battery, a Lithium Sulphur (Li—S) battery, a Zinc-mercuric oxide battery, a Zinc-silver oxide battery, a Lead-acid battery or the like.

The load and energy estimation model configuration controller (110) may be configured to acquire one or more parameters associated with a battery (150). The one or more parameters may be, for example, but not limited to, a current level, a voltage level, a SOC, a temperature, or a combination of at least one or two thereof. The SOC is defined as a ratio of the available capacity and a maximum possible charge that can be stored in the battery (150). Based on the one or more acquired parameters, the load and energy estimation model configuration controller (110) may be configured to determine a load and energy estimation model. In an example, the load and energy estimation model may be determined by obtaining a pulse duration of the battery (150), a depth of discharge of the battery (150), a cut-off voltage associated with a pre-set voltage of the battery (150), and a temperature of the battery (150) at a first time interval based on the one or more acquired parameters, and determining the load and energy estimation model based on the pulse duration of the battery (150), the depth of discharge of the battery (150), the cut-off voltage associated with the pre-set voltage of the battery (150), and the temperature of the battery (150).

In an example, an overall thermal balance in a cell of the battery (150) can be written as:

$$\frac{\delta(\rho CT)}{\delta t} = \frac{\delta}{\delta x}\left(\lambda \frac{\delta T}{\delta x}\right) + Q \tag{1}$$

With the boundary conditions:

$$@x = \text{terminals}; -\lambda \frac{\delta T}{\delta x} = h(T - T_0) \tag{2}$$

$$@x = \text{separator interface}; -\lambda \frac{\delta T}{\delta x} = Q_i(\text{interfacial, flux}) \tag{3}$$

In the above expressions, $\lambda$, $\rho$, C, h are the thermal conductivity, density of the material, specific heat capacity and heat transfer coefficient, respectively, T is the cell temperature at a particular location, x, and $T_0$ is the ambient temperature. Q is the total heat flux density, which can be further split into its components:

$$Q = Q_{rev} + Q_{irrev} + Q_{ohm1} + Q_{ohm2} \tag{4}$$

$$Q_{rev} = Faj T\frac{\partial U}{\partial T} \tag{5}$$

$$Q_{irrev} = Faj(\Phi_1 - \Phi_2 - U) \tag{6}$$

$$Q_{ohm1} = K\left[\frac{\delta \Phi_1}{\delta x}\right]^2 \tag{7}$$

$$Q_{ohm2} = \sigma\left[\frac{\delta \Phi_2}{\delta x}\right]^2 + \frac{2RT(1-t_+)}{F}\frac{1}{C_2}\left[\frac{\delta C_2}{\delta x}\right]\left[\frac{\delta \Phi_2}{\delta x}\right] \tag{8}$$

where, F, R, t+ are the Faraday's constant, Universal gas constant and the transference number respectively, a is the particle specific surface area, j is the current density, U is the equilibrium potential, $\phi$ is the solid and liquid phase potential (with subscript 1 for solid and 2 for liquid), K, $\sigma$ are the solid and liquid phase conductivities respectively with C2 being the liquid phase concentration. In the above expressions, a subscript 1 denotes the solid phase (electrode) and 2 denotes the liquid phase (electrolyte). $Q_{rev}$ is the system entropy contribution and Qirrev is due to the system overpotential. Qohm1,2 are the ohmic contributions due to the electrode and electrolyte phase.

The sources of heat as expressed in equations (5)-(8), can be put back into equation (1) and by way of volume averaging, temperatures at various locations (2 terminals and 2 interfaces) can be obtained. As far as the battery management system (100) is concerned, a single representative cell temperature would suffice as temperature gradient across the cell is expected to be negligible due to reasons explained below. The thermal diffusivity, $D_Q$ given by:

$$D_Q = \frac{\lambda}{\rho C} \tag{9}$$

$D_Q$ is a measure of how fast heat energy percolates through the battery management system (100) and the time scale for this process, $t_Q$, is given by:

$$t_Q = \frac{L^2}{D_Q} \quad (10)$$

Here, L is the length scale in the flow dimension. With the entire system thickness of the order of 100μ ($10^{-4}$), thermal conductivity, λ of the order of 1 W/mK, and volumetric heat capacity, ρC, of the order of $10^6$ J/K/m$^3$, $D_Q$ comes to a scale of $10^{-6}$ m$^2$/s and thus $t_Q$ is of the order of $(10^{-4})^2/10^{-6}$=0.01 s. Thus, the percolation of heat is an incredibly fast process (as compared to any other transport and kinetic processes in the battery management system (100); for example, diffusion time scale of lithium ions inside the electrode particles, which equals radius$^2$/diffusivity, is of the order of 100-1000s typically) inside an electrochemical cell, leading to quick equilibration of temperatures across the cell, making the spatial variation of temperature irrelevant.

Further, the example battery management system (100) suggests a lumped thermal model ignoring the gradient term. The lumped thermal capacity model can be an existing transient heat conduction model. The lumped thermal model accurately accounts for temperature fluctuation in the cell that influences transport and kinetic processes occurring during charge and discharge processes. A single representative cell temperature is calculated using the following volume averaged expression of heat balance shown below:

$$(\rho C)_{lump} \frac{dT}{dt} = \sum Q_{neg} L_{neg} - \sum Q_{pos} L_{pos} - h_{lump}(T - T_0) \quad (11)$$

where:

$$(\rho C)_{lump} = (\rho CL)_{neg} + (\rho CL)_{sep} + (\rho CL)_{pos} \quad (12)$$

$$h_{lump} = \frac{[abs(h_{pos}) + abs(h_{neg})]}{2} \quad (13)$$

In the above expressions, the subscripts neg, sep, pos, indicate the property and formulation at an anode, a separator and a cathode respectively. The introduction of such a lumped thermal model (which can be solved by an explicit time marching scheme) helps in easing the computational load of the calculations without compromising on the details extracted from the battery management system (100).

Because of the lumped thermal capacity model, it is possible to de-couple a thermal module from a rest of Reduced Order Model (ROM). The thermal module is used to independently calculate the heat contribution due to the different independent processes as described in equations (5)-(8) and the cell temperature is updated after every simulation time step through the explicit time marching scheme as shown in equation (11). The updated temperature is then fed into a ROM equation, where the temperature effects on transport and kinetic properties are updated before they are used in potential and voltage calculations.

Further, the power limit estimation (PLE) may be used to characterize battery state of power, whose main aim is to calculate the limits of the battery operation through the maximum power and current extractable at the particular time point in charge and discharge. The examples may be used to estimate for state of power using the current limit estimate (CLE) model (i.e., load and energy estimation model). The load and energy estimation model may be the maximum sustainable current, which will take the battery management system (100) to the pre-set minimum voltage cut-off in the desired pulse duration, at a particular discharge time (SOC) and ambient and cell temperature. The determination of the load and energy estimation model under the given conditions of depth of discharge (DOD), pulse duration, cut-off voltage and temperature is done through an iterative scheme using a ROM-Lumped thermal module (T-ROM). Mathematically:

$$CLE = f(\Delta t, V_{cutoff}, SOC, T) \quad (14)$$

Here, Δt, $V_{cutoff}$, SOC, T are the pulse duration, cut-off voltage, discharge state of charge or depth of discharge (DOD), cell temperature respectively. For the convenience of experimental validation, the user of the battery management system (100) fixes the pulse duration and the cut-off voltage (1 s and 3V in this case respectively) in the initial sets of results. One important parameter which is fed into the iterative method is the lumped resistance, $R_{lump}$, which represents the cell resistance at any particular instant of time and SOC, and state (like cell temperature). It is defined as:

$$R_{lump}(SOC, T) = \frac{V_{cell}(SOC, T) - OCV(SOC, T)}{I(t)} \quad (15)$$

Here, $V_{cell}$, OCV are the present cell voltage, open circuit voltage respectively at the given SOC and temperature with I(t) being the current drawn at a given time instant. While this is a simple approach, it is to be noted that, the cell voltage calculated via the ROM model, represents the cell state holistically.

Whenever there is a prompt to calculate the load and energy estimation model, the then $R_{lump}$ along with the required handles in equation (14) are fed into the iterative scheme to calculate the load and energy estimation model. The method of calculating the load and energy estimation model lies on a very simple logic of calculating the value of the maximum current, and in turn the threshold SOC namely $SOC_{cutoff}$, which will take the battery management system (150) to the desired cut-off voltage, $V_{cutoff}$, in the desired time duration, Δt, using $R_{lump}$ (calculated using equation (15), at the time of CLE prompt) and OCV ($SOC_{cutoff}$), as shown in equation (16).

$$CLE(SOC, V_{cutoff}, T, \Delta t) = \frac{OCV(SOC_{cutoff}, T) - V_{cutoff}}{R_{lump}(SOC, T)} \quad (16)$$

The maximum current calculation for the load and energy estimation model is based on calculating the $SOC_{cutoff}$ (which the system will reach to, within the given CLE time duration, Δt) using an initial guess of the CLE (set to the present value of current), then updating this current value using equation (16), until the convergence criterion is met (defined by the user of the battery management system (100) or the Original Equipment Manufacturer (OEM). The $SOC_{cutoff}$ calculation requires using a small loop of the ROM module where the solid phase concentration field gets updated every time step. One of the assumptions used in the $SOC_{cutoff}$ calculation for CLE, is that for the given time and pulse duration, Δt, the concentration fields in the electrolyte, and the temperature do not vary much. This assumption is well justified as the pulse duration, $\Delta t$, is usually of the order of a few seconds.

Further, the load and energy estimation model configuration controller (110) may be configured to identify the power limit of the battery (150) based on the load and energy estimation model. After identifying the power limit of the battery (150), the load and energy estimation model configuration controller (110) is configured to determine a power margin of the battery (150) at the usage time interval. Further, the load and energy estimation model configuration controller (110) may be configured to determine that the power margin of the battery (150) exceeds a predefined threshold level. The predefined threshold level is determined by the user of the battery (150) or the OEM of the battery (150).

In determining that the power margin of the battery (150) exceeds the predefined threshold level, the load and energy estimation model configuration controller (110) is configured to perform one or more actions. The one or more actions may be, as only non-limiting examples, notifying a user to close one or more applications running in an electronic device, notifying the user to close one or more background applications running in the electronic device, reducing a clock speed of a processor of the electronic device, notifying a remaining capacity of the battery (150), notifying a maximum current extractable from the battery (150) at a discharge condition, notifying a temperature dependent effect of the battery (150) to a user, predicting a State of Health (SOH) (discussed below with regard to FIG. 8) of the battery (150), providing a predetermined route based on determined power demands in a vehicle, notifying the vehicle to charge the battery (150), or a combination of at least one or two thereof. The application may be, for example, but not limited to, a gaming application, a social networking application, a chat application, a weather application, a finance application, a health-related application, a monitoring application or the like.

The load and energy estimation model estimates the maximum current that can be extracted from the battery (150), given the duration for which the current is needed, given the depth of discharge of the battery (150), given the battery temperature, given the voltage cut-off to which the battery (150) should reach once the current is applied for the required duration.

In an example, the SOH of the battery (150) is predicted by obtaining a maximum current profile associated with a fresh battery, estimating a maximum current profile associated with the battery (150) using the load and energy estimation model, determining a ratio of the estimated maximum current profile associated with the battery (150) with the maximum current profile associated with the fresh battery, and predicting the SOH of the battery (150) based on the determined ratio.

In an example, the load and energy estimation model is determined based on changes in the ambient temperature of the battery (150) and the cell temperature of the battery (150). In an example, the load and energy estimation model is determined when the discharge mode of the battery is changed from a first level to a second level (as discussed below with regard to FIG. 7).

Further, the load and energy estimation model configuration controller (110) may be physically implemented by analog or digital circuits such as, but not limited to, logic gates, integrated circuits, microprocessors, microcontrollers, memory circuits, passive electronic components, active electronic components, optical components, hardwired circuits, or the like, and may optionally be driven by firmware.

Unlike typical methods and systems, the example battery management system (100) informs the user regarding the performance limitations of the battery (150) in a fast, simple and accurate manner. In the example battery management system (100), the temperature influenced performance of the battery (150) based on factors such as available capacity and power drawable, is estimated in an effective and simple manner. The example battery management system (100) computes the real-time temperature variation, and updates model parameters to obtain an accurate estimate of the resistance for PLE calculations, so as to inform the user to take corrective action in an effective and reliable manner.

The example battery management system (100) may prevent accidental shutdown of the battery (150) by informing or alerting the user in real-time, and allows the user of the battery management system (100) to take corrective action in a reliable manner. The battery management system (100) may precisely estimate the maximum load extractable from the battery (150) which is determined based on, as only examples, the state of charge and temperature of the battery. The battery management system (100) may accurately estimate the wide range of temperatures from −30° C. to 60° C. The example battery management system (100) may estimate available maximum current (and thus power) for on-board implementation on the electronic device and the vehicle. The examples may be used to estimate a peak power and current deliverable from the battery (150) when the battery (150) is in use, and while the battery is in a discharging mode.

The electronic device may be, as only examples, and not limited to, a cellular phone, a smart phone, a smart watch, a smart TV, a smart dishwasher, a Personal Digital Assistant (PDA), a tablet computer, a laptop computer, a virtual reality device, an immersive system, an Internet of Things (IoT), a smart sensor, a drone or the like. The vehicle can be, for example, but not limited to an electrical vehicle (EV), a hybrid electric vehicle (HEV), a plug-in hybrid electric vehicle (PHEV), a battery based electric vehicle (BEV) or the like.

Further, the processor (140) may be configured to execute instructions stored in the memory (130) and to perform various processes. The communicator (120) may be configured to communicate internally between internal hardware components and with external devices via one or more networks. The memory (130) may store instructions to be executed by the processor (140). The memory (130) may include non-volatile storage elements. Examples of such non-volatile storage elements may include magnetic hard discs, optical discs, floppy discs, flash memories, or forms of electrically programmable memories (EPROM) or electrically erasable and programmable (EEPROM) memories. In addition, the memory (130) may, in some examples, be considered a non-transitory storage medium. In examples, a non-transitory storage medium may store data that can, over time, change (e.g., in Random Access Memory (RAM) or cache).

At least one of the plurality of modules may be implemented through an Artificial intelligence (AI) model. A function associated with AI may be performed through the non-volatile memory, the volatile memory, and the processor (140). The processor (140) may include one or a plurality of processors. At this time, one or a plurality of processors may be a general purpose processor, such as a central processing unit (CPU), an application processor (AP), or the like, a graphics-only processing unit such as a graphics processing unit (GPU), a visual processing unit (VPU), and/or an AI-dedicated processor such as a neural processing unit (NPU).

The one or more processors are configured to control the processing of the input data in accordance with a predefined operating rule or artificial intelligence (AI) model stored in the non-volatile memory and the volatile memory. The predefined operating rule or artificial intelligence model may be provided through training or learning.

In the examples, being provided through learning means that a predefined operating rule or AI model of a desired characteristic is made by applying a learning algorithm to a plurality of learning data. The learning may be performed in a device itself in which AI is performed, and/or may be implemented through a separate server and system.

The AI model may include a plurality of neural network layers. Each layer has a plurality of weight values, and performs a layer operation through calculation of a previous layer and an operation of a plurality of weights. Examples of neural networks include, but are not limited to, convolutional neural network (CNN), deep neural network (DNN), recurrent neural network (RNN), restricted Boltzmann Machine (RBM), deep belief network (DBN), bidirectional recurrent deep neural network (BRDNN), generative adversarial networks (GAN), and deep Q-networks.

In one or more examples learning algorithm is a method for training a predetermined target device (for example, a robot) using a plurality of learning data to cause, allow, or control the target device to make a determination or prediction. Examples of learning algorithms include, but are not limited to, supervised learning, unsupervised learning, semi-supervised learning, or reinforcement learning.

Although FIG. 1 illustrates various hardware components of the battery management system (100), one or more examples are not limited thereto. In some examples, the battery management system (100) may include less or more number components. Further, the labels or names of the components are used only for illustrative purposes, and does not limit the scope of the invention. One or more components may be combined to perform the same or substantially similar functions in the battery management system (100).

Figure 2:
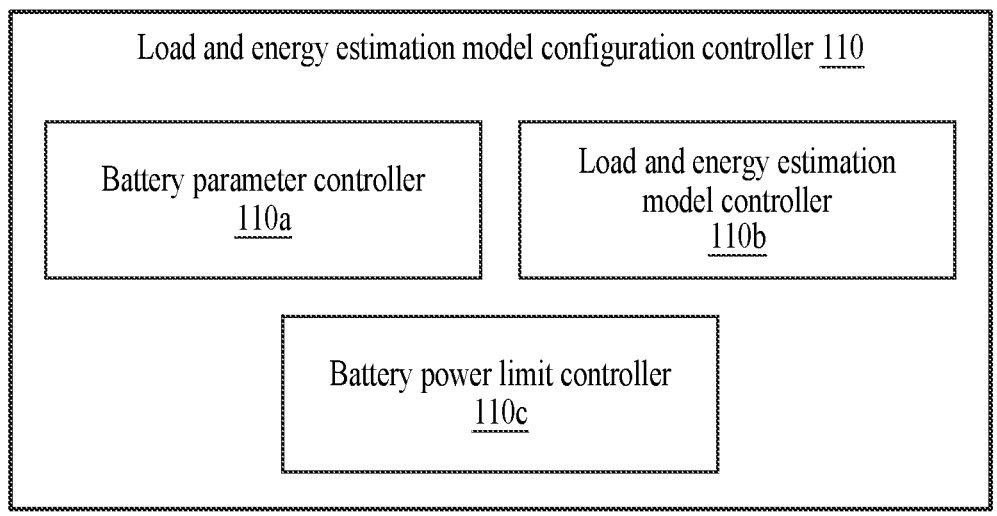
FIG. 2 illustrates various hardware components of an example load and energy estimation model configuration controller, in accordance with one or more embodiments.

FIG. 2 illustrates various hardware components of the load and energy estimation model configuration controller (110), in accordance with one or more embodiments.

In one or more examples, the load and energy estimation model configuration controller (110) include a battery parameter controller (110a), a load and energy estimation model controller (110b), and a battery power limit controller (110c).

The battery parameter controller (110a) is configured to acquire the one or more parameters associated with the battery (150). The battery parameter controller (110a) may be physically implemented by analog or digital circuits such as, but not limited to, logic gates, integrated circuits, microprocessors, microcontrollers, memory circuits, passive electronic components, active electronic components, optical components, hardwired circuits, or the like, and may optionally be driven by firmware.

Based on the acquired one or more parameter, the load and energy estimation model controller (110b) is configured to determine the load and energy estimation model. In an example, the load and energy estimation model controller (110b) is configured to obtain the pulse duration of the battery (150), the depth of discharge of the battery (150), the cut-off voltage associated with the pre-set voltage of the battery (150), and the temperature of the battery (150) at the first time interval based on the one or more acquired parameter, and determine the load and energy estimation model based on the pulse duration of the battery (150), the depth of discharge of the battery (150), the cut-off voltage associated with the pre-set voltage of the battery (150), and the temperature of the battery (150).

The load and energy estimation model controller (110b) may be physically implemented by analog or digital circuits such as logic gates, integrated circuits, microprocessors, microcontrollers, memory circuits, passive electronic components, active electronic components, optical components, hardwired circuits, or the like, and may optionally be driven by firmware.

The battery power limit controller (110c) is configured to identify the power limit of the battery (150) based on the load and energy estimation model. After identifying the power limit of the battery (150), the battery power limit controller (110c) is configured to determine the power margin of the battery (150) at the first usage time interval. Further, the battery power limit controller (110c) is configured to determine whether the power margin of the battery (150) exceeds the predefined threshold level. Upon determining that the power margin of the battery (150) exceeds the predefined threshold level, the battery power limit controller (110c) is configured to perform one or more actions, such as, but not limited to, notify a user to close at least one application running in an electronic device, notify the user to close at least one background application running in the electronic device, reduce a clock speed of a processor of the electronic device, notify a remaining capacity of the battery, notify a maximum current extractable from the battery at a discharge condition, notify a temperature dependent effect of the battery to a user, predict a state of health (SOH) of the battery, provide a route based on power demands in a vehicle, notify a user of the vehicle to charge the battery, or a combination of at least one or two thereof.

The battery power limit controller (110c) may be physically implemented by analog or digital circuits such as logic gates, integrated circuits, microprocessors, microcontrollers, memory circuits, passive electronic components, active electronic components, optical components, hardwired circuits, or the like, and may optionally be driven by firmware.

Although FIG. 2 illustrates various hardware components of the load and energy estimation model configuration controller (110), the examples are not limited thereto. In other examples, the load and energy estimation model configuration controller (110) may include less, or more, components. Further, the labels or names of the components are used only for illustrative purpose and does not limit the scope of the invention. One or more components can be combined together to perform same or substantially similar function in the load and energy estimation model configuration controller (110).

The controllers (110, 110a, 110b, and 110c) are illustrated as modules distinguished from the processor (140), but are not limited thereto. In an example, at least a portion of, or an entirety of, the load and energy estimation model configuration controller (110) may be integrated into the processor (140). The processor (140) may perform an operation of the battery parameter controller (110a), an operation of the load and energy estimation model controller (110b), an operation of the battery power limit controller (110c), or a combination of at least one or two thereof.

The battery management system (100) is illustrated as including the load and energy estimation model configuration controller (110), the communicator (120), the memory (130), the processor (160), and the battery (150), but is not limited thereto.

In an example, at least a portion of, or an entirety of, the load and energy estimation model configuration controller (110), the communicator (120), the memory (130), the processor (160), and the battery (150), may be integrated into battery-operated systems or devices (e.g., mobile phones, EVs, etc.).

Figure 3:
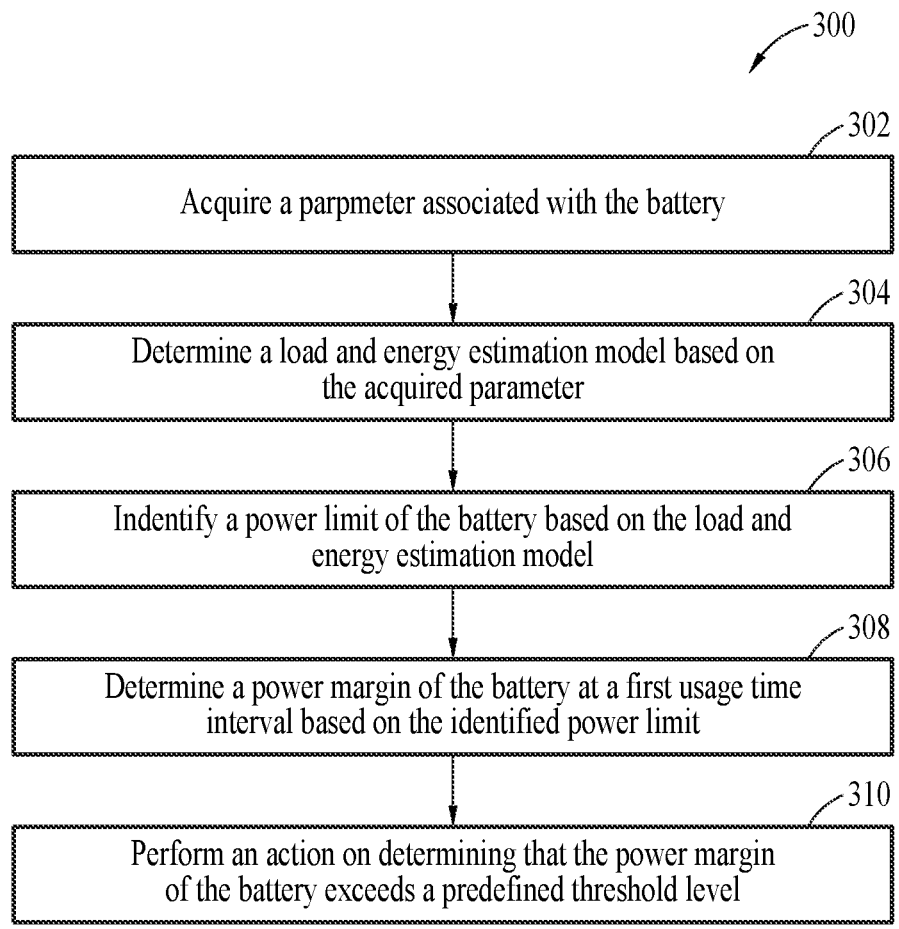
FIG. 3 illustrates a flow diagram illustrating a battery management method, in accordance with one or more embodiments.

FIG. 3 illustrates a flow diagram (300) illustrating a battery management method for a battery (150), in accordance with one or more embodiments. The operations (302-310) are performed by the load and energy estimation model configuration controller (110). The operations in FIG. 3 may be performed in the sequence and manner as shown, although the order of some operations may be changed or some of the operations omitted without departing from the spirit and scope of the illustrative examples described. Many of the operations shown in FIG. 3 may be performed in parallel or concurrently. One or more blocks of FIG. 3, and combinations of the blocks, can be implemented by special purpose hardware-based computer that perform the specified functions, or combinations of special purpose hardware and computer instructions. In addition to the description of FIG. 3 below, the descriptions of FIGS. 1-2 are also applicable to FIG. 3, and are incorporated herein by reference. Thus, the above description may not be repeated here.

In operation 302, one or more parameters associated with the battery (150) may be acquired. The one or more parameters may include the current level, the voltage level, the SOC, the temperature, or a combination of at least one or two thereof.

In operation 304, the method includes determining the load and energy estimation model based on the one or more acquired parameters.

In operation 306, the method includes identifying the power limit of the battery (150) based on the load and energy estimation model.

In operation 308, the method includes determining the power margin of the battery (150) at the first usage time interval based on the identified power limit.

In operation 310, the method includes performing the one or more actions discussed above based on a determination that the power margin of the battery exceeds the predefined threshold level.

Such examples may be used to predict the PLE current required for the battery management system (100) to reach the specified cut-off voltage in specified times (e.g., 1 seconds), at different depths of discharge. Such examples may be used to estimate available maximum current for on-board implementation on the battery management system (100). Such examples may be used to provide a desirable user experience eliminating unanticipated battery behavior such as sudden battery power loss when exposed to extremities of temperature.

Based on one or more examples, in an example, the user of the electronic device may want to use heavy power usage applications, such as but not limited to, financial applications, on the electronic device (e.g., laptop). Thus, the demand for instantaneous power increases on the electronic device, so that the battery management system (100) notifies the user about the battery power level, and suggests, or informs the user, to charge the battery (150) to use the example financial application on the electronic device, thus avoiding the shutting down of the battery (150) without notice to the user.

In another example, the user of the electronic device may have moved from a cold environment to a relatively warm environment. Based on the example, the battery management system (100) may accurately incorporate the effect of performance influencing parameters (e.g., temperature) on the battery, so that the significant drop in maximum extractable current with drop in temperature is captured. Thus, the battery management system (100) avoids the shutting down of the battery (150) without notice to the user.

In another example, the user of the EV suddenly increases a load on the EV due to the steep incline. Thus, the demand for instantaneous power increases, so that the battery management system (100) notifies the user about the battery power level and suggests to charge the battery (150) for certain range. This results in avoiding the shutting down of the battery (150) without notice to the user.

The various actions, acts, blocks, steps, or the like in the flow diagrams (300) may be performed in the order presented, in a different order or simultaneously. Further, in some examples, some of the actions, acts, blocks, steps, or the like may be omitted, added, modified, skipped, or the like without departing from the scope of the invention.

Figure 4A:
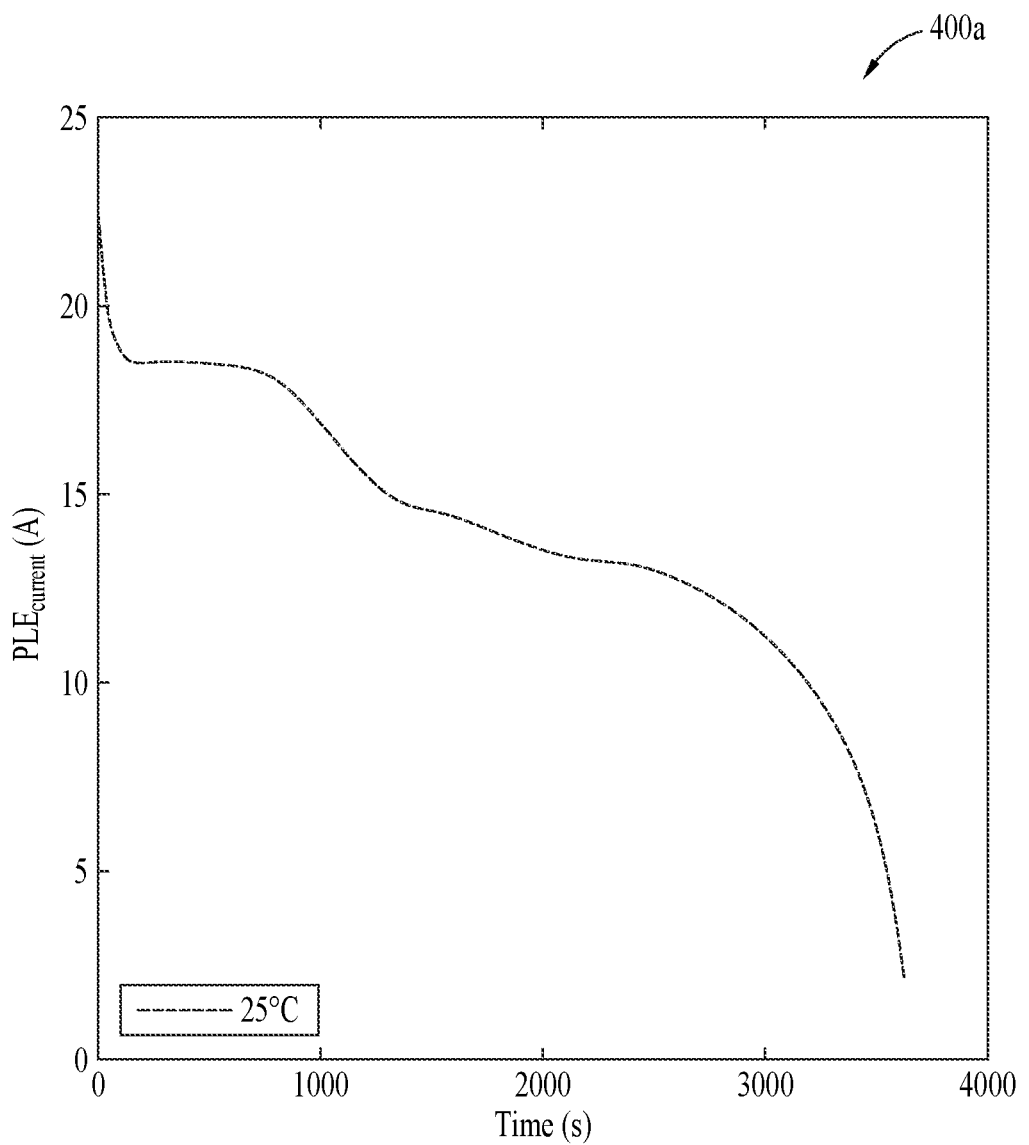
FIGS. 4a-4c are example graphs in which power limit management at different scenarios of temperature and discharge SOC is depicted, in accordance with one or more embodiments.
Figure 4B:
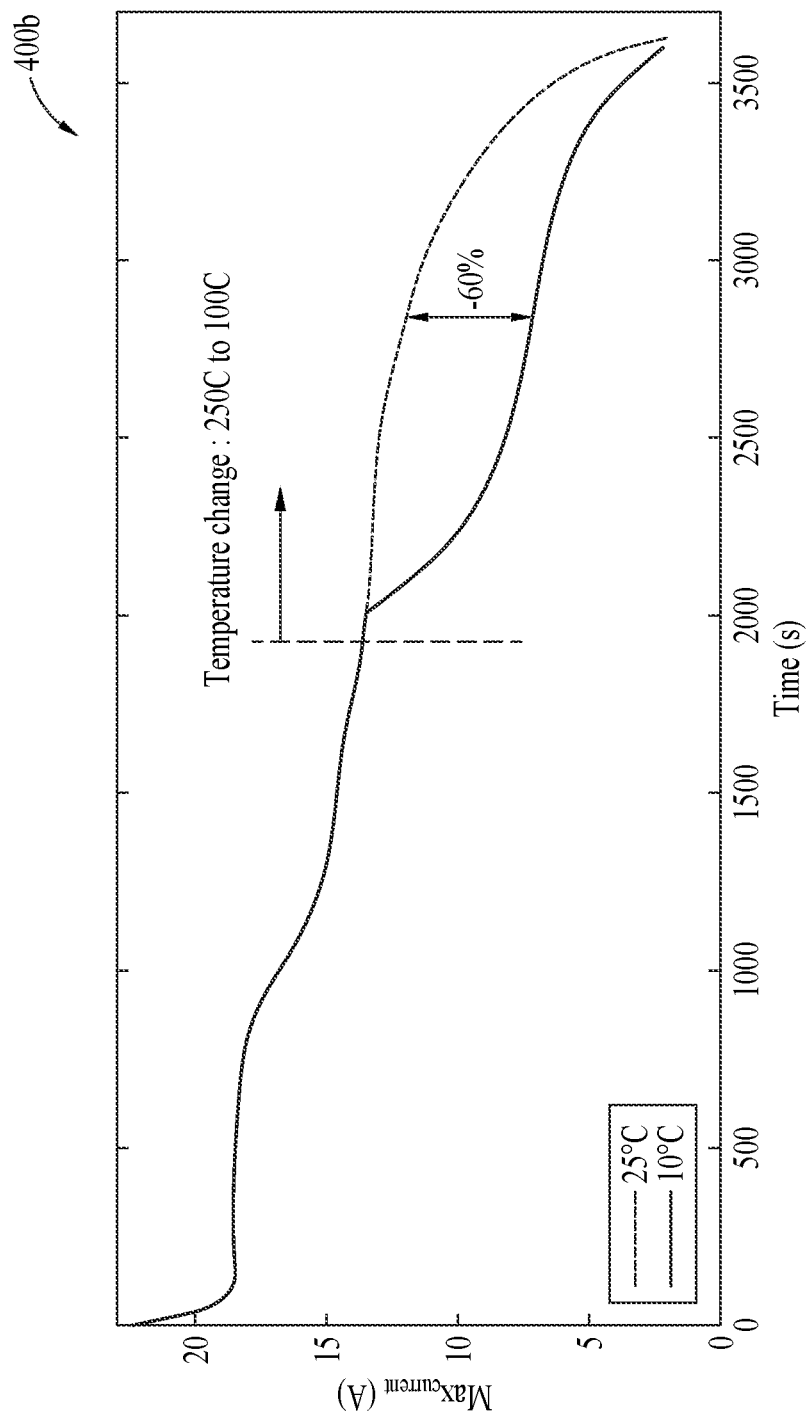
Figure 4C:
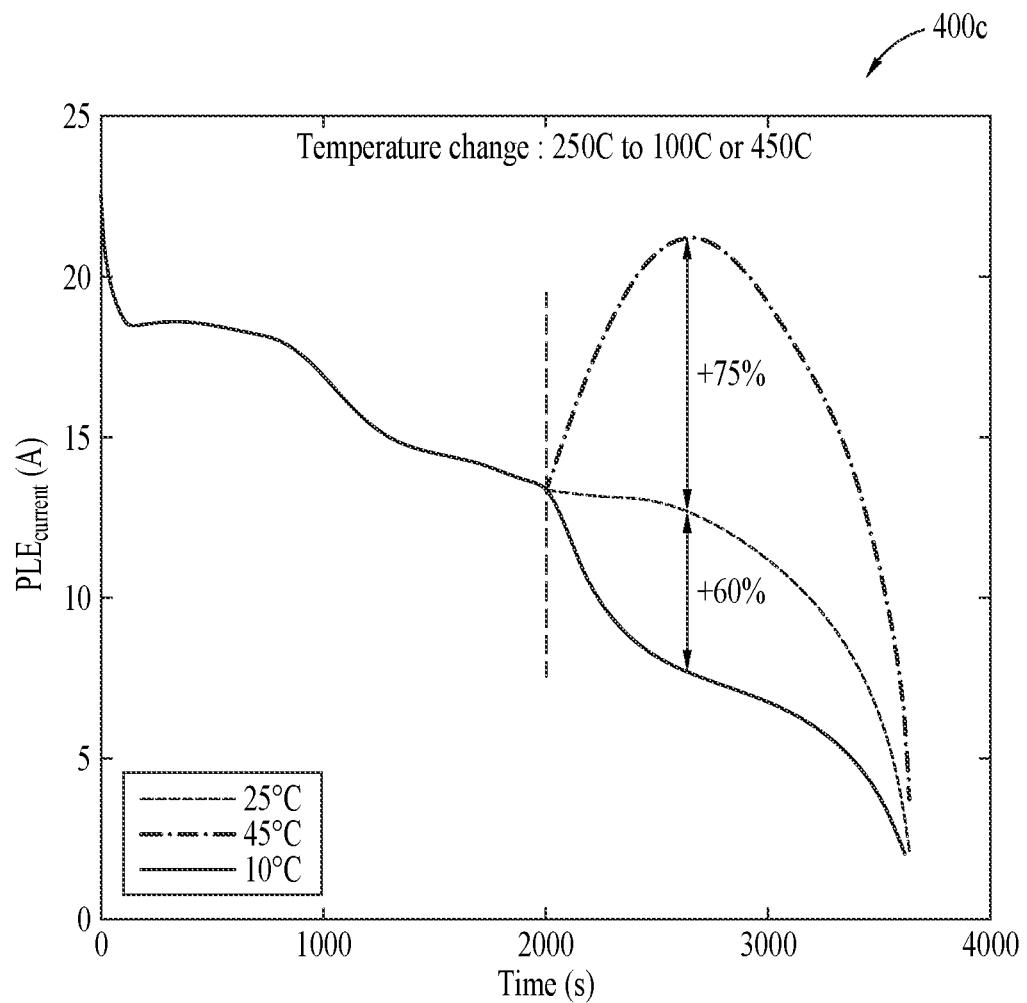

FIGS. 4A-4C are example graphs (400a-400c) in which power limit management at different scenarios of temperature and discharge SOC are depicted, in accordance with one or more embodiments. Typically, a power limit estimation current (i.e., $PLE_{current}$) is defined as the maximum extractable current from the battery (150) for the given duration (typically 1 second, for example), at any given discharge condition, which will take the battery voltage to the predetermined cut-off voltage: usually 3.0V. This is a function of many parameters, especially discharge SOC and temperature.

Referring to the FIG. 4A, the $PLE_{current}$ is determined as a function of discharge time for a regular 1C discharge cycle. As expected, as the battery (150) is discharged, less maximum current can be extracted from the battery (150).

The change in $PLE_{current}$ occurs especially when there is a sudden change in ambient temperature. This is very crucial, especially in EV and mobile applications, when the user of the battery management system (100) wants to extract more power like climbing a steep slope and using power hungry applications. This change is captured based on the examples, so that the examples may be used to accurately update the lumped resistance of the battery model in real-time.

Referring to FIG. 4B, when the battery ambient temperature drops suddenly at about 2000 seconds, the $PLE_{current}$ may drop by up to 60%. This change in maximum extractable current is intimated to the battery management system (100) and the user in real-time for appropriate action to be taken.

Referring to the example of FIG. 4C, in an opposite scenario, an increase in temperature may result in an increase in the $PLE_{current}$, due to physics.

Figure 5:
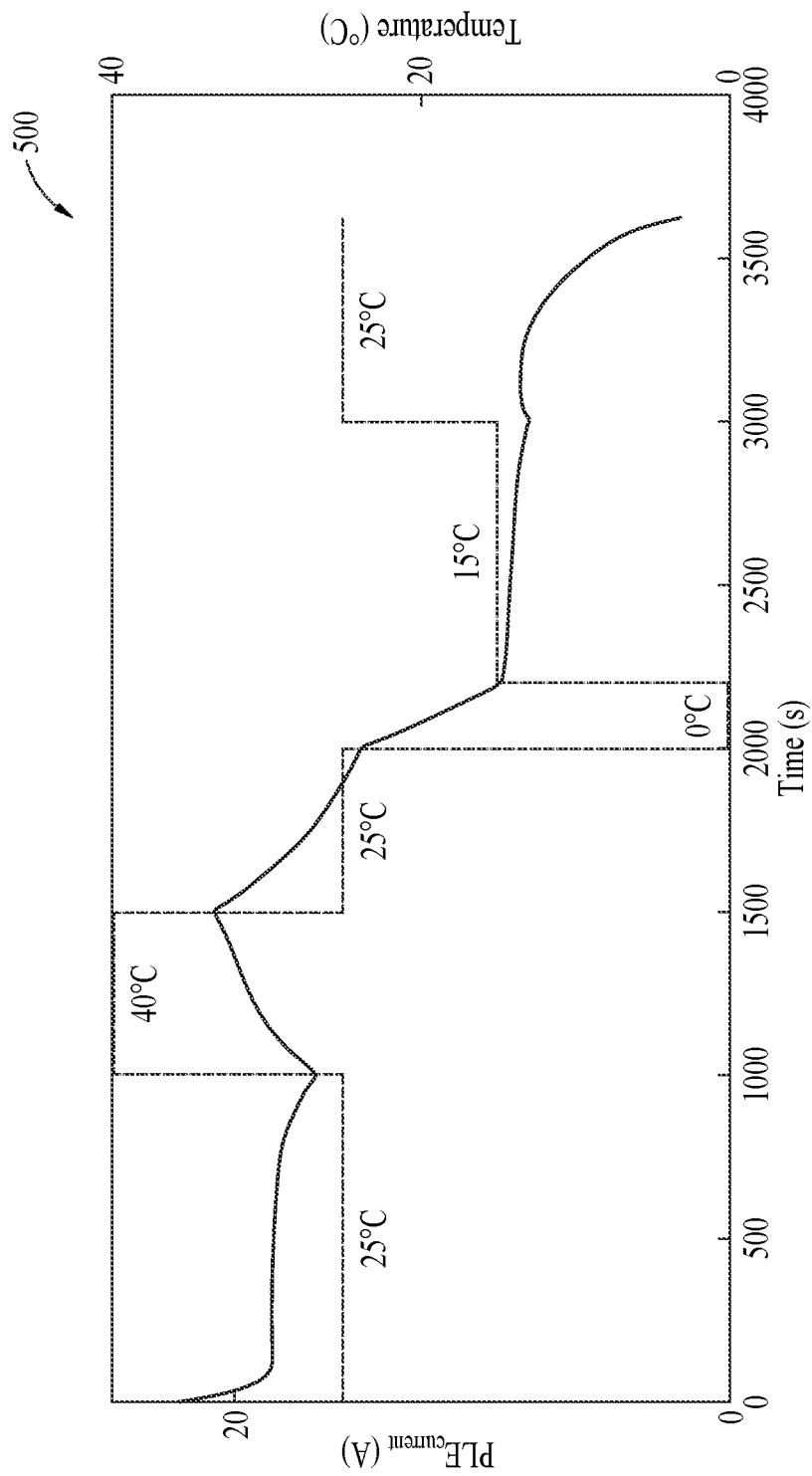
FIG. 5 is an example graph in which power limit management profile with different ambient temperature triggers during operation is depicted, in accordance with one or more embodiments.

FIG. 5 is an example graph (500) in which power limit management profile with different ambient temperature triggers during operation is depicted, in accordance with one or more embodiments.

Referring to FIG. 5, multiple changes in the temperature over the battery operation period to extreme temperature windows are accounted to provide accurate performance measurement to the user of the battery management system (100). Further, whenever there is a change in the ambient temperature and device temperature and external factors, the example is prompted to update the user in real-time regarding the performance limitations and characteristics of the battery (150) in an accurate manner.

Figure 6:
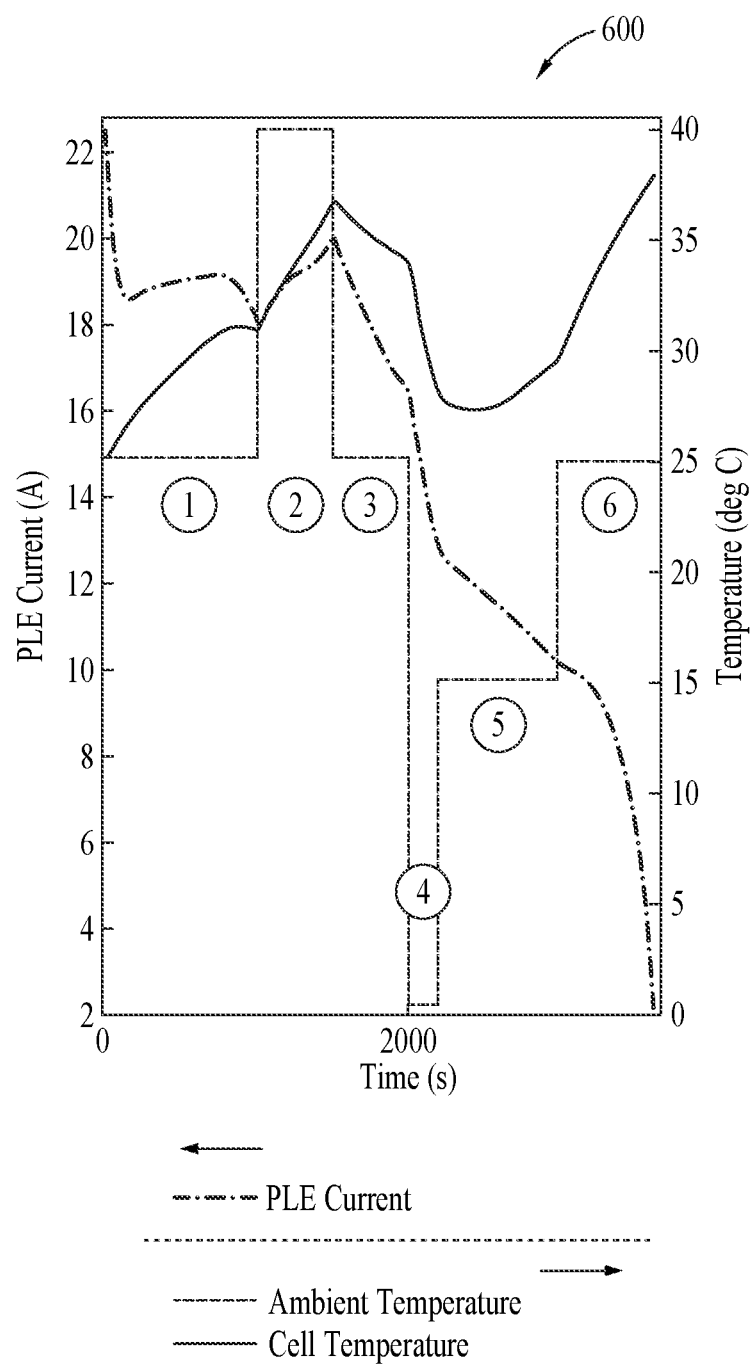
FIG. 6 is an example graph in which power limit management profile with cell and ambient temperatures is depicted, in accordance with one or more embodiments.

FIG. 6 is an example graph (600) in which power limit management profile with cell and ambient temperatures is depicted, in accordance with one or more embodiments.

Referring to FIG. 6, the physics based PLE model captures certain nuances of the cell performance which are intricate in nature:

Region 1: Cell discharges at 25° C. ambient temperature, but the cell temperature increases due to the thermal balance. There is a sudden drop in the PLE at the beginning of discharge due to the initial resistance and stabilizes (for example, slightly increases and decreases) with cell temperature.

Region 2: Although the ambient temperature is suddenly increased to 40° C., the cell temperature responds slower to the stimulus due to various dynamics. The PLE also rises accordingly as resistance decreases in the battery management system (100).

Region 3: Similar to region 2, the reverse happens, with cell temperature decreasing slowly, and PLE also dropping.

Region 4: Here the ambient temperature drops suddenly to 0° C., but for a very short time. Thus, the cell temperature also drops sharply, but because of the previous temperature history (40° C. and 25° C.) and dynamics, the cell temperature is still much above 25° C. But the rapid drop also results in the PLE drop.

Region 5: With the ambient temperature rising to 15° C., the cell temperature, due to equilibration from previous ambient temperature effects, is maintained around 25° C. and above. Thus, although there was an ambient temperature increase, the PLE may keep dropping due to the discharge effects.

Region 6: With another ambient temperature spike to 25° C., the cell temperature rises, but the discharge is almost complete, and thus the PLE drops drastically due to voltage decrease at the end of discharge.

Figure 7:
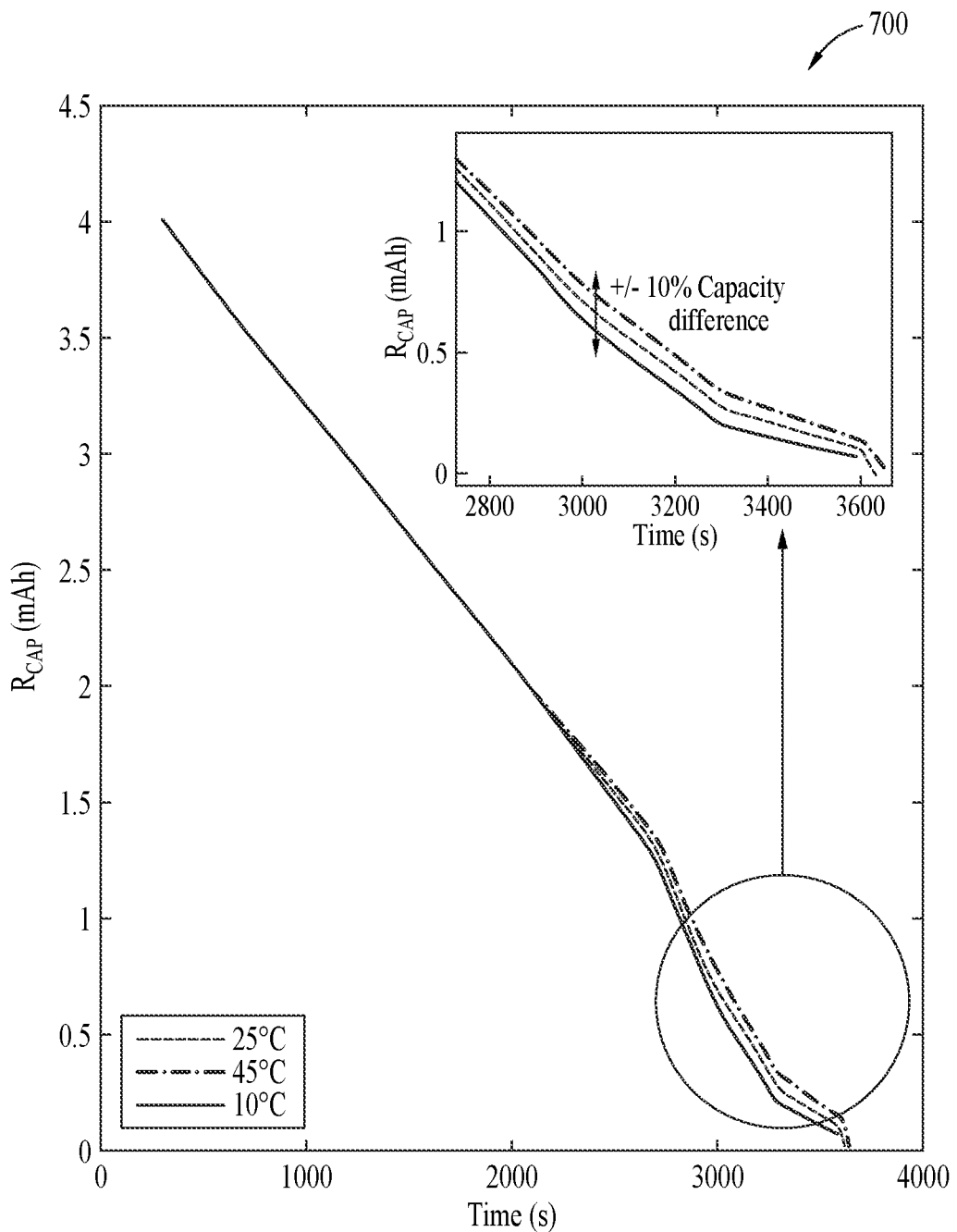
FIG. 7 is an example graph in which available capacity profile at different temperatures with discharge time is depicted, in accordance with one or more embodiments.

FIG. 7 is an example graph (700) in which available capacity profile at different temperatures with discharge time is depicted, in accordance with one or more embodiments. The ambient temperature also has an effect on the available capacity that can be extracted from the battery management system (100). This effect is modelled accurately through the examples. As shown in the FIG. 7, the available capacity increases and decreases by 10% with increase and decrease in temperature.

Figure 8:
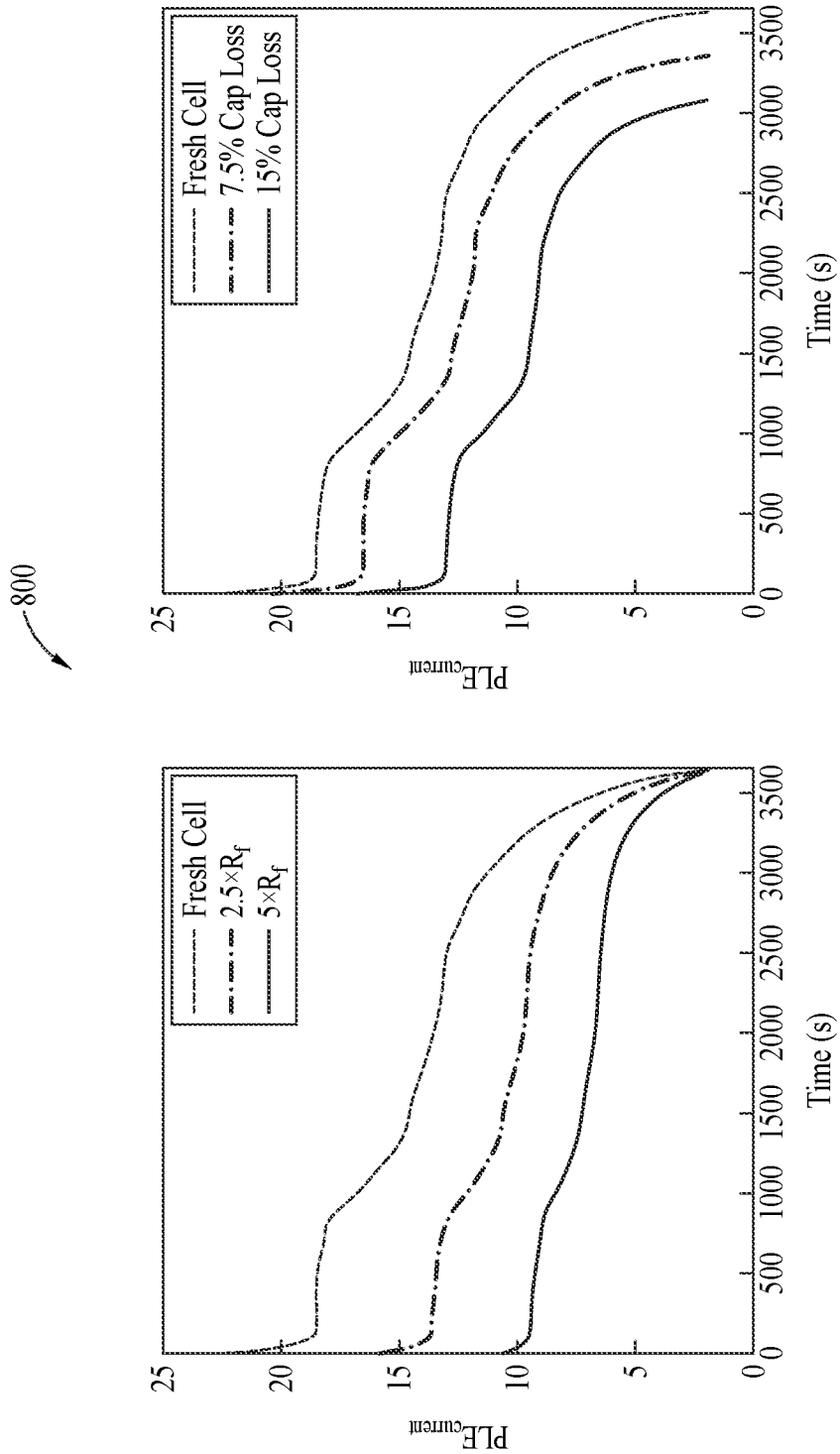
FIG. 8 is an example graph in which effect of resistive and capacity loss on degradation via a power limit management profile is depicted, in accordance with one or more embodiments.

FIG. 8 illustrates example graphs (800) in which the effect of resistive and capacity loss on degradation via the power limit management profile is depicted, in accordance with one or more embodiments. The protocol may also be used on degraded cells. The example is SOH aware (due to the in-built physics), and may be used to determine the PLE of the battery management system (100). The effect of degradation via film resistance, active material loss etc. is incorporated in the lumped resistance calculated for the example. Thus, the effect is seen in the PLE profiles as well as seen in the FIG. 8.

As illustrated in FIG. 8, the effect of resistive and capacity loss on degradation is seen via the PLE profiles of the notation "a" and "b" of FIG. 8 respectively. Depending upon the nature of degradation (capacitive, resistive, and both), the effect on PLE is captured very well by the example.

The operations for battery management, for example, operations (302 to 310) described above with reference to FIG. 3 have been described as being performed mainly by the battery management system (100), but are not limited thereto. In an example, the battery management system (100) may collect at least one parameter associated with a battery, and an electronic device (e.g., a mobile phone and an EV) connected to the battery management system (100) may obtain the one or more parameter associated with the battery from the battery management system (100). The electronic device may perform the operations for battery management by implementing the one or more parameters obtained from the battery management system (100). In an example, the electronic device may determine a load and energy estimation model based on the obtained one or more parameters, identify a power limit of the battery based on the load and energy estimation model, determine a power margin of the battery at a first usage time interval based on the identified power limit, and perform at least one action based on a determining that the power margin of the battery exceeds a predefined threshold level.

A battery management system is described herein as encompassing such an electronic device, but is not limited thereto. In an example, the battery management system (100) may be construed as including a battery pack and battery management elements connected to the battery pack.

The examples disclosed herein can be implemented through at least one software program running on at least one hardware device and performing network management functions to control the elements. The elements can be at least one of a hardware device, or a combination of hardware device and software module.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of at least one embodiment, those skilled in the art will recognize that the embodiments herein can be practiced with modification within the spirit and scope of the embodiments as described herein.

The battery management system 100, load and energy estimation model configuration controller 110, communicator 120, memory 130, processor, 140, battery 150, battery parameter controller 110a, load and energy estimation model controller 110b, battery power limit controller 110c, as well as the remaining devices, apparatuses, units, modules, and other components described herein are implemented by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer.

Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIM D) multiprocessing, multiple-instruction single-data (MISD) multiprocessing, and multiple-instruction multiple-data (MIMD) multiprocessing.

The methods illustrated in FIGS. 1-8 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application, that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A battery management method comprising:
   determining, by a battery management system, a load and energy estimation model based on obtaining a pulse duration of a battery, a depth of discharge of the battery, a cut-off voltage associated with a pre-set voltage of the battery, and a temperature of the battery based on at least one acquired parameter associated with the battery,
   wherein the at least one parameter comprises a current level, a voltage level, a state of charge (SOC), a temperature, or a combination of at least two of the parameters thereof;

identifying, by the battery management system, a power limit of the battery based on the load and energy estimation model;

determining, by the battery management system, a power margin of the battery at a first usage time interval based on the identified power limit; and performing, by the battery management system, at least one action, based on a determination that the power margin of the battery exceeds a predefined threshold level.

2. The method of claim 1, wherein the at least one parameter is acquired by the battery management system.

3. A battery management method comprising:

determining, by a battery management system, a load and energy estimation model based on at least one acquired parameter associated with the battery, wherein the at least one parameter comprises a current level, a voltage level, a state of charge (SOC), a temperature, or a combination of at least two of the parameters thereof;

identifying, by the battery management system, a power limit of the battery based on the load and energy estimation model;

determining, by the battery management system, a power margin of the battery at a first usage time interval based on the identified power limit; and performing, by the battery management system, at least one action, based on a determination that the power margin of the battery exceeds a predefined threshold level, wherein the at least one action comprises notifying a user to close at least one application running in an electronic device, notifying the user to close at least one background application running in the electronic device, reducing a clock speed of a processor of the electronic device, notifying the user of a remaining capacity of the battery, notifying the user of a maximum current extractable from the battery at a discharge condition, notify the user of a temperature dependent effect of the battery, predicting a state of health (SOH) of the battery, providing a route based on power demands in a vehicle, notifying a user of the vehicle to charge the battery, or a combination of at least two of the actions thereof.

4. The method of claim 1, wherein the load and energy estimation model is determined based on a change in at least one of an ambient temperature of the battery and a cell temperature of the battery.

5. The method of claim 1, wherein the load and energy estimation model is determined when a discharge mode of the battery is changed from a first level to a second level.

6. The method of claim 3, wherein the SOH of the battery is predicted by:

obtaining a maximum current profile associated with a fresh battery;

estimating a maximum current profile associated with the battery based on the load and energy estimation model;

determining a ratio of the estimated maximum current profile associated with the battery with the maximum current profile associated with the fresh battery; and predicting the SOH of the battery based on the determined ratio.

7. A battery management system, comprising:
one or more processors;
a memory; and
a load and energy estimation model configuration controller, coupled with the one or more processors and the memory, and configured to:

determine a load and energy estimation model based on obtaining a pulse duration of a battery, a depth of discharge of the battery, a cut-off voltage associated with a pre-set voltage of the battery, and a temperature of the battery based on at least one acquired parameter associated with the battery, wherein the at least one parameter comprises a current level, a voltage level, a state of charge (SOC), a temperature, or a combination of at least two of the parameters thereof;

identify a power limit of the battery based on the load and energy estimation model;

determine a power margin of the battery at a first usage time interval based on the identified power limit; and perform at least one action based on a determination that the power margin of the battery exceeds a predefined threshold level.

8. The battery management system of claim 7, wherein the at least one parameter is acquired by the battery management system.

9. The battery management system of claim 7, wherein the at least one action comprises notifying a user to close at least one application running in an electronic device, notifying the user to close at least one background application running in the electronic device, reducing a clock speed of a processor of the electronic device, notifying the user of a remaining capacity of the battery, notifying the user of a maximum current extractable from the battery at a discharge condition, notifying the user of a temperature dependent effect of the battery, predicting a state of health (SOH) of the battery, providing a route based on power demands of a vehicle, notifying a user of the vehicle to charge the battery, or a combination of at least two of the actions thereof.

10. The battery management system of claim 7, wherein the load and energy estimation model is determined based on a change in at least one of an ambient temperature of the battery and a cell temperature of the battery.

11. The battery management system of claim 7, wherein the load and energy estimation model is determined when a discharge mode of the battery is changed from a first level to a second level.

12. The battery management system of claim 9, wherein the SOH of the battery is predicted by:

obtaining a maximum current profile associated with a fresh battery;

estimating a maximum current profile associated with the battery based on the load and energy estimation model;

determining a ratio of the estimated maximum current profile associated with the battery with the maximum current profile associated with the fresh battery; and predicting the SOH of the battery based on the determined ratio.

13. An apparatus, comprising:
one or more processors, configured to:

determine a load and energy estimation model based on obtaining a pulse duration of a battery, a depth of discharge of the battery, a cut-off voltage associated with a pre-set voltage of the battery, and a temperature of the battery based on an obtained parameter associated with a battery;

identify a power limit of the battery based on the determined load and energy estimation model;

determine a power margin of the battery at a usage time interval based on the identified power limit, and perform a user-based action when the power margin is determined to exceed a predetermined threshold level.

14. The apparatus of claim 13, wherein the apparatus is at least one of an electronic device and an electric vehicle.

15. The apparatus of claim 13, wherein the at least one battery-related parameter comprises a current level, a voltage level, a state of charge (SOC), and a temperature.

16. The apparatus of claim 13, wherein the user-based action comprises at least one of notifying a user to close at least one application running in an electronic device, notifying the user to close at least one background application running in the electronic device, reducing a clock speed of a processor of the electronic device, notifying the user of a remaining capacity of the battery, notifying the user of a maximum current extractable from the battery at a discharge condition, notifying the user of a temperature dependent effect of the battery, predicting a state of health (SOH) of the battery, providing a route based on power demands of a vehicle, notifying a user of the vehicle to charge the battery, or a combination of at least one or two thereof.

17. The method of claim 1, wherein the at least one action comprises notifying a user to close at least one application running in an electronic device, notifying the user to close at least one background application running in the electronic device, reducing a clock speed of a processor of the electronic device, notifying the user of a remaining capacity of the battery, notifying the user of a maximum current extractable from the battery at a discharge condition, notify the user of a temperature dependent effect of the battery, predicting a state of health (SOH) of the battery, providing a route based on power demands in a vehicle, notifying a user of the vehicle to charge the battery, or a combination of at least two of the actions thereof.

* * * * *